US012568666B2

(12) United States Patent
Akiyama et al.

(10) Patent No.: US 12,568,666 B2
(45) Date of Patent: Mar. 3, 2026

(54) INSULATED GATE TURN-OFF DEVICE WITH SHORT CHANNEL PMOS TRANSISTOR

(71) Applicant: Pakal Technologies, Inc, San Francisco, CA (US)

(72) Inventors: Hidenori Akiyama, Miyagi (JP); Paul M Moore, Hillsboro, OR (US)

(73) Assignee: Pakal Technologies, Inc., San Francisco, CA (US)

( * ) Notice: Subject to any disclaimer, the term of this patent is extended or adjusted under 35 U.S.C. 154(b) by 419 days.

(21) Appl. No.: 18/208,072

(22) Filed: Jun. 9, 2023

(65) Prior Publication Data

US 2024/0088226 A1     Mar. 14, 2024

Related U.S. Application Data

(60) Provisional application No. 63/351,275, filed on Jun. 10, 2022.

(51) Int. Cl.
  H10D 62/17     (2025.01)
  H10D 18/65     (2025.01)

(52) U.S. Cl.
  CPC ......... H10D 62/206 (2025.01); H10D 18/655 (2025.01)

(58) Field of Classification Search
  CPC ...... H10D 18/01; H10D 18/00; H10D 18/021;
      H10D 18/211; H10D 18/221; H10D
      18/241; H10D 18/40; H10D 18/60; H10D
      18/65; H10D 18/655; H10D 18/80; H10D
      62/104; H10D 62/105; H10D 62/108;
      H10D 62/111; H10D 62/117; H10D
      62/123; H10D 62/124; H10D 62/125;

H10D 62/126; H10D 62/141; H10D
62/148; H10D 64/233; H10D 64/291;
H10D 64/519; H10D 64/027; H10D
64/512; H10D 64/513; H10D 84/131;
H10D 84/135; H10D 84/136; H10D
84/676; H10D 62/60; H10D 62/206;
H10D 62/114; H10D 62/115; H10D
62/142; H10D 62/192; H10D 62/199;
H10D 30/021; H10D 30/025;
(Continued)

(56) References Cited

U.S. PATENT DOCUMENTS

| | | | | |
|---|---|---|---|---|
| 2015/0349104 A1* | 12/2015 | Rodov | ................. | H10D 18/655 |
| | | | | 257/133 |
| 2017/0256614 A1* | 9/2017 | Akiyama | ............. | H10D 62/206 |
| 2019/0393331 A1* | 12/2019 | Akiyama | ............. | H10D 18/655 |

* cited by examiner

*Primary Examiner* — Natalia A Gondarenko
(74) *Attorney, Agent, or Firm* — Patent Law Group; Brian Ogonowsky

(57)     ABSTRACT

An insulated gate turn-off (IGTO) device, formed as a die, has a layered structure including a p+ layer (e.g., a substrate), an n– epi layer, a p-well, an n-layer over the p-well, p+ regions over the n-layer, trenched gate regions formed in the p-well, and n+ regions between the gate regions, so that vertical npn and pnp transistors are formed. The device is formed of a matrix of cells. To turn the device on, a positive voltage is applied to the gate, referenced to the cathode. The cells contain a vertical p-channel MOSFET, for shorting the base of the npn transistor to its emitter, to turn the npn transistor off when the p-channel MOSFET is turned on by a slight negative voltage applied to the gate. One or more p-layers are implanted into the p-well, below the n-layer, for independently controlling the turn-on and turn-off threshold voltages and the breakdown voltage.

12 Claims, 3 Drawing Sheets

(58) Field of Classification Search
CPC .... H10D 30/0297; H10D 30/60; H10D 30/63;
H10D 30/635
USPC ....... 257/153, 107, 120, 132, 133, 137, 138,
257/139, 140, 142, 144, 175
See application file for complete search history.

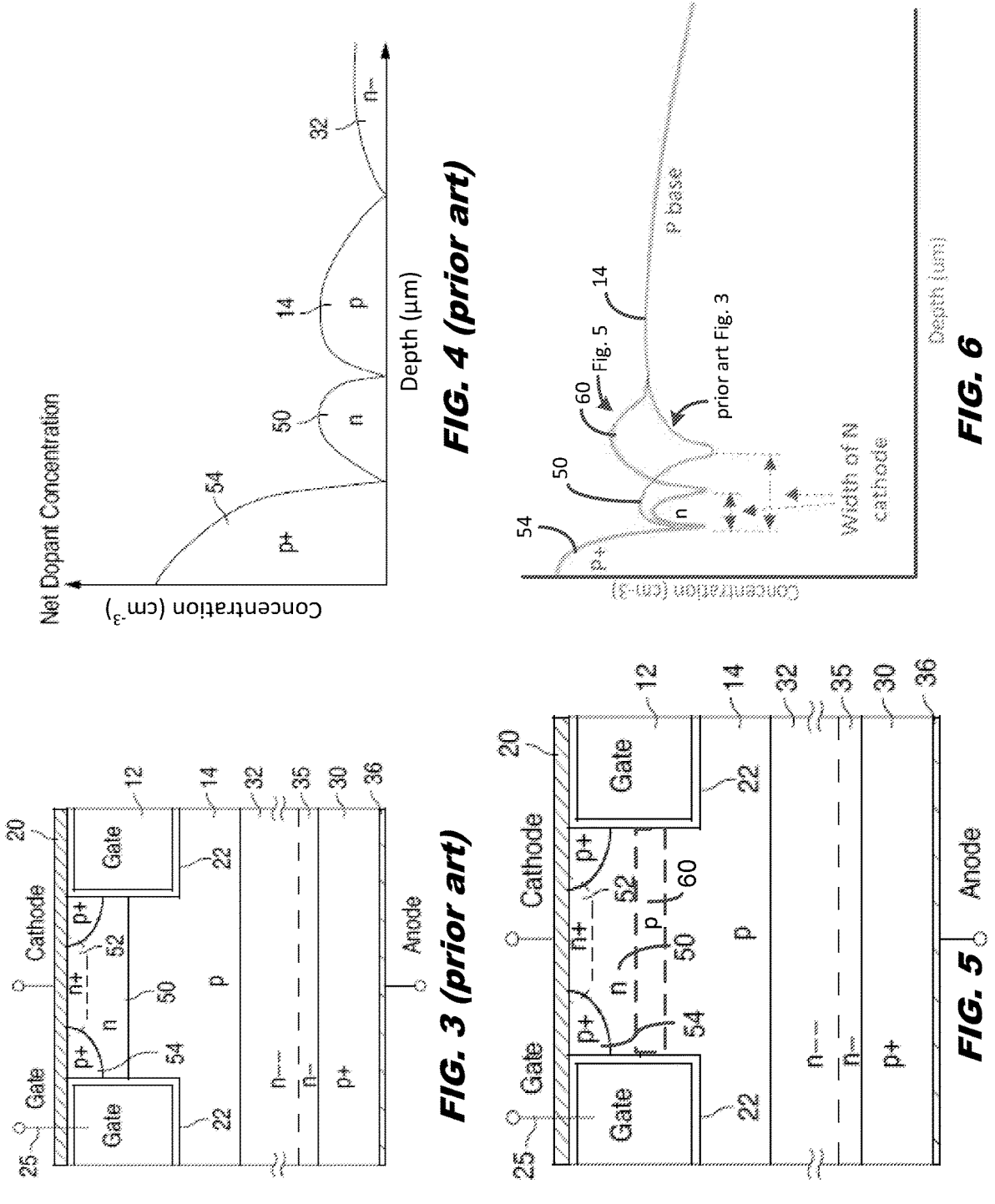

INSULATED GATE TURN-OFF DEVICE WITH SHORT CHANNEL PMOS TRANSISTOR

CROSS-REFERENCE TO RELATED APPLICATIONS

This application is based on provisional application Ser. No. 63/351,275, filed Jun. 10, 2022, by Hidenori Akiyama et al., assigned to the present assignee and incorporated herein by reference.

FIELD OF THE INVENTION

This invention relates to insulated gate turn-off (IGTO) devices and, more particularly, to an IGTO device design that includes an improved turn-off feature.

BACKGROUND

Prior art FIG. 1 is a cross-section of a small portion of an IGTO device 10 (similar in some respects to a thyristor) reproduced from the assignee's U.S. Pat. No. 8,878,237, incorporated herein by reference. The portion is near an edge of the device and shows a plurality of cells having vertical gates 12 formed in insulated trenches. A 2-dimensional array of the cells may be formed in a common p-well 14, and the cells are connected in parallel. The edge of the device suffers from field crowding, and the edge cell is modified to increase ruggedness of the device. The edge cell has an opening 16 in the n+ source region 18 where the cathode electrode 20 shorts the n+ source region 18 to the p-well 14. Such shorting increases the tolerance to transients to prevent unwanted turn on and prevents the formation of hot spots. The configuration of the edge cell may also be used in other cells of the device for a more uniform current flow across the device.

FIG. 2 is a top down view of only three of the cells, showing only the top semiconductor surface.

The vertical gates 12 are insulated from the p-well 14 by an oxide layer 22. A p+ contact 24 region (FIG. 2) may be used at the opening 16 of the edge cell for improved electric contact to the p-well 14. The narrow gates 12 (doped polysilicon) are connected together outside the plane of the drawing and are coupled to a gate voltage via the gate electrode 25 contacting the polysilicon portion 28. A patterned dielectric layer 26 insulates the metal from the various regions. The guard rings 29 at the edge of the cell reduce field crowding for increasing the breakdown voltage.

An npnp semiconductor layered structure is formed. There is a bipolar pnp transistor 31 (FIG. 3) formed by a p+ substrate 30, an n– epitaxial (epi) layer 32, and the p-well 14. There is also a bipolar npn transistor 34 (FIG. 3) formed by the n-epi layer 32, the p-well 14, and the n+ source region 18. An n-type buffer layer 35, with a dopant concentration higher than that of the n– epi layer 32, reduces the injection of holes into the n– epi layer 32 from the p+ substrate 30 when the device is conducting. A bottom anode electrode 36 contacts the substrate 30, and a cathode electrode 20 contacts the n+ source region 18. The p-well 14 surrounds the gate structure, and the n– epi layer 32 extends to the surface around the p-well 14.

When the anode electrode 36 is forward biased with respect to the cathode electrode 20, but without a sufficiently positive gate bias, there is no current flow, since the product of the betas (gains) of the pnp and npn transistors is less than one (i.e., there is no regeneration activity).

When the gate is forward biased, electrons from the n+ source region 18 become the majority carriers along the gate sidewalls and below the bottom of the trenches in an inversion layer, causing the effective width of the npn base (the portion of the p-well 14 between the p-layers) to be reduced. As a result, the beta of the npn transistor increases to cause the product of the betas to exceed one. This results in "breakover," when holes are injected into the lightly doped n– epi layer 32 and electrons are injected into the p-well 14 to fully turn on the device. Accordingly, the gate bias initiates the turn-on, and the full turn-on (due to regenerative action) occurs when there is current flow through the npn transistor as well as current flow through the pnp transistor.

When the gate bias is removed, such as the gate electrode 25 being shorted to the cathode electrode 20, the IGTO device turns off. The gate may also be biased to a small negative voltage, such as minus 8 volts, which decreases the turn-off time.

One issue with the device of FIG. 1 is that a high current (which may be constant or a transient) may cause latch-up, and a relatively large negative gate voltage is needed to turn the device off. Such a large negative voltage may not be convenient to generate. During latch-up, the on-resistance is desirably lower, and the device acts as a thyristor.

FIG. 3 is reproduced from U.S. Pat. RE47072, incorporated herein by reference. FIG. 3 is a cross-sectional view of a single cell of an IGTO device, in accordance with one embodiment of the invention. FIG. 3 is a modification of a single cell in FIG. 1, and all cells may be similarly modified. FIG. 4 is a dopant profile from the top through to the n-epi layer 32 along the gate sidewall. The common features of FIGS. 1 and 3 are labelled the same.

In contrast to the IGTO device of FIG. 1, the cell of FIG. 3 includes an n-layer 50, formed by ion implantation, that is more lightly doped than an n+ source region 52. A p+ region 54, formed by ion (boron) implantation, is formed on both sides of the n+ source region 52, adjacent the gate 12, and extends below the n+ source region 52. The n-layer 50 extends below the p+ region 54 to form a channel in a vertical p-channel MOSFET. The p+ regions 54 and the n+ source region 18 are shorted together by the cathode electrode 20.

FIG. 4 shows the relative net doping levels of the p+ region 54, n-layer 50, p-well 14, and n-epi layer 32.

The operation of the cell is as follows. When the gate is sufficiently positive, above the threshold voltage, the base of the vertical npn transistor narrows to increase its beta, so that the product of the betas of the pnp transistor and the npn transistor is greater than one. This causes significant current to flow through the device, which turns the device on even more. Therefore, the turn-on operation is the same as described with respect to FIG. 1.

When the gate voltage is below the threshold, such as the gate being shorted to the cathode electrode 20, the resulting wide p-type base between the n-type layers 50 and 32 creates a wide-base npn transistor having a low beta. As a result, the product of the npn and pnp transistor betas is less than one, so the device is turned off.

When the current through the IGTO device is sufficiently high, latch-up occurs, initiating thyristor action, and the device cannot be turned off simply by shorting the gate to the cathode electrode 20. The IGTO device may be turned off more rapidly by applying a gate voltage sufficiently lower than the cathode voltage (to exceed the threshold voltage of the p-channel MOSFET), the n-layer 50 adjacent to the gate 12 inverts to create a p-channel between the p+ region 54 and the p-well 14. This conducting p-channel MOSFET turns off the base-emitter diode of the npn transistor, forcing the npn transistor to turn off. Therefore, there is no regenerative action. Shorting is not required, since the base-emitter voltage just has to be low enough to turn off the npn transistor. The doping level of the n-layer 50 determines the threshold voltage of the p-channel MOSFET. Accordingly, the IGTO device of FIG. 3 may be turned off by applying a small negative gate threshold voltage for the p-channel MOSFET.

One issue with the device of FIG. 3 is the lack of the ability to trade off performance parameters such as the threshold voltage of the p-channel MOSFET and the breakdown or breakover voltage of the device.

Since the p+ region 54, the n-layer 50, and the n+ source region 52 are formed by ion implantation and diffusion, the various regions' boundaries are difficult to define, and the formation of one region affects the other regions. As a result, it is difficult to adjust each parameter to have the desired performance. For example, the characteristics of the various regions (doping profile) affect the turn-on threshold voltage, the turn-off threshold voltage, the breakdown voltage, and the forward voltage. The dependency of the device characteristics on the doping profile results in slight differences from lot to lot and results in non-optimal turn-on threshold voltages, turn-off threshold voltages, breakdown voltages, and forward voltages.

Accordingly, what is needed is an improvement to an IGTO device, having a turn-off p-channel MOSFET (a PMOS transistor), where the device parameters can be better controlled.

SUMMARY

The present device provides a more efficient turn-off capability while also allowing more independent control of device parameters such as threshold voltage and device breakdown or breakover voltage.

An IGTO device having vertical gates has a plurality of cells connected in parallel. Various epitaxial and implanted layers form npnp layers that create vertical bipolar npn and pnp transistors. Each cell generally includes a top n+ source region, a p-well between and below opposing vertical gates, an n- epi layer below the p-well, and a p+ substrate to form the npnp layers. A positive voltage is applied to the p+ substrate (the anode), and a more negative voltage is applied to the n+ source region (the cathode). A sufficiently positive gate voltage reduces the base width of the npn transistor to increase its gain, turning on the device to cause a current to flow between the anode and cathode. Removing the gate voltage (or shorting the gate to the cathode) turns the device off.

To turn the device off with a negative gate voltage, the cells are formed to have upper p+ regions on both sides of the n+ source region and extending vertically below the n+ source region, and an n-layer is formed between the p-well and the upper p+ regions. The n+ source regions and the upper p+ regions are shorted by the cathode electrode. The p+ regions, the p-layer, and the p-well form a vertical p-channel MOSFET, where the n-layer adjacent the vertical gate forms the body. The p-channel MOSFET turns on with a negative gate voltage (a threshold voltage) relative to the cathode electrode (the p+ region acts as a source for the p-channel MOSFET). Turning on the p-channel MOSFET shorts (to an extent) the base-emitter of the wide-base vertical npn transistor to turn it off and to thereby turn off the IGTO device.

To better control the device parameters due to the variations in the implanted p+ regions, the n+ source regions, and the n-layer, one or more additional boron implants are performed, as described below.

In one embodiment, an additional boron (p-type) implant is performed to form an additional p-type layer within the p-well, adjacent to the bottom of the n-layer, where the p-layer has a p-type dopant concentration higher than that of the p-well and lower than that of the p+ regions. This additional boron implant forming the p-layer increases the p-type concentration of the p-well adjacent the vertical gate, which controllably increases the turn-on threshold voltage of the IGTO device and increases the breakdown voltage (due to reducing the spread of a depletion layer) without increasing the forward voltage when the device is turned on. The turn-on threshold voltage can thus be precisely controlled by the additional p-layer to avoid unwanted turn on.

The additional boron implant decreases the length of the PMOS transistor channel by adding the more highly doped p-layer, so there is less resistance to hole current flow when the PMOS transistor is turned on by a negative gate voltage, resulting in much faster turn-off speed and lower switching loss.

In another embodiment, another boron implant can form a more highly doped p-layer in the p-well spaced away from the bottom of the n-layer, closer to the bottom of the vertical gates. This second boron implant increases the breakdown voltage of the IGTO device without affecting the threshold voltage of the PMOS transistor. This boron implant can be performed along with the previously described boron implant to form two vertically-separated p-layers for independent control of the breakdown voltage, forward voltage, turn-on threshold voltage, and turn-off threshold voltage.

Other embodiments are described.

BRIEF DESCRIPTION OF THE DRAWINGS

FIG. 3 is a cross-sectional view of a prior art single cell, that may replace the cells in the device of FIG. 1, where a vertical PMOS transistor is formed to rapidly turn off the device with a negative gate voltage.

FIG. 4 is a dopant profile of the cell of FIG. 3 in the silicon along the trench gate, where the x axis is the depth into the device starting from the upper p+ region.

FIG. 5 is a cross-sectional view of a cell, in accordance with one embodiment of the invention, where there is an extra boron implant to form a more highly doped p-layer in the p-well in contact with the bottom of the n-layer below the n+ source regions. The implanted p-layer may effectively reduce the thickness of the n-layer, which reduces the length of the channel in the p-channel MOSFET. This p-layer affects the turn-off threshold voltage, forward voltage, and breakdown voltage.

FIG. 6 is a dopant profile of the device of FIG. 5 along the trench wall comparing the prior art dopant profile of FIG. 4 with the dopant profile of the device of FIG. 5.

Elements that are the same or equivalent are labelled with the same numerals.

DETAILED DESCRIPTION

Figure 1:
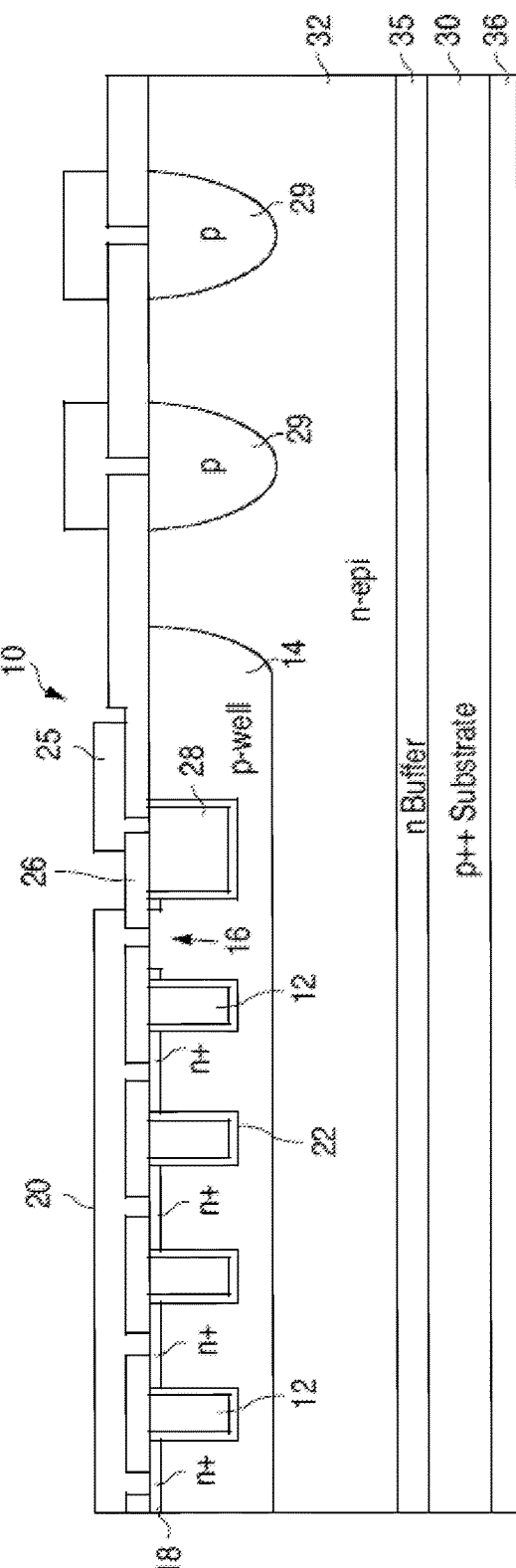
FIG. 1 is a cross-sectional view of an edge portion of the assignee's prior art IGTO device having an edge cell with the p-well shorted to the n+ source layer to improve ruggedness.
Figure 2:
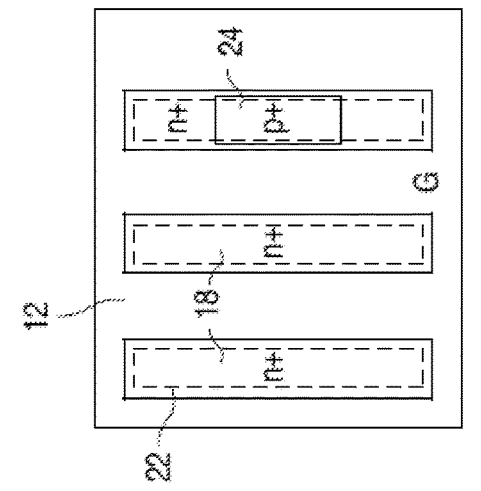
FIG. 2 is a top down view of three cells in the device of FIG. 1 at the surface of the semiconductor regions.

FIG. 5 is a cross-sectional view of a single cell of an IGTO device, where the IGTO device is formed as a single die, in accordance with one embodiment of the invention. Each cell in FIG. 1 can be similar to FIG. 5. FIG. 6 is a dopant profile from the top through to the n-epi layer 32 along the gate sidewall.

In contrast to FIG. 3, FIG. 5 includes an implanted p-layer 60 that is formed near the bottom of the n-layer 50 so as to abut the n-layer 50 and effectively reduce the length of a resulting p-channel of a PMOS transistor. Boron is used as the implanted ions. The boron may be implanted either before or after implanting the n-type dopants to form the n-layer 50. Those skilled in the art will know the implant energy and dosage to form the p-layer 60 for any depth and thickness. Different energies may be used to form the p-layer 60 or the same energy may be used, depending on the desired thickness of the p-layer 60. The implanted dopants are activated and diffused by an anneal step. The anneal step also repairs damage to the silicon crystal due to the implantation.

The dopant concentration of the p-layer 60 is higher than that of the p-well 14 and lower than that of the p+ regions 54.

The depth of the p-layer 60 will typically be less than 10 microns from the top surface, and its thickness may be on the order of 0.5 microns or less.

The p-layer 60 will deplete less than the p-well 14 when the device is off and will thus increase the breakdown voltage. The p-layer 60 also reduces the n-type channel length in the turn-off PMOS transistor to reduce the negative turn-off threshold voltage and increase the speed of turn-off when the PMOS transistor is turned on with a negative gate voltage. The speed of turn off is also increased due to the lower resistance between the p-well 14 (containing excess holes immediately after the device is turned off) and the cathode electrode 20. In other words, the hole carriers are more rapidly conducted to the cathode electrode 20 after the device ceases to conduct vertical current. Switching losses are reduced. Accordingly, the IGTO device of FIG. 5 may be turned off by applying a negative gate threshold voltage for the p-channel MOSFET.

Since the p-layer 60 increases the p-type dopant concentration in the p-well base, the turn-on threshold voltage for the IGTO device will also increase (i.e., a higher gate voltage is needed to sufficiently reduce the npn transistor base width to increase its beta to start regenerative action).

Since the characteristics of the p-layer 60 are fairly easy to control, the various device characteristics can be controlled independently of the other doped regions, allowing each of the various regions to be optimized for various device parameters, such as turn-on and turn-off threshold voltages, breakdown voltage, forward voltage, etc.

After the p-layer 60 is formed by implanting boron, the doped layers above it and the trenched gates are then formed, followed by depositing the cathode metal. Alternatively, the p-layer 60 and the doped layers above it may be formed after the trenched gates are formed.

FIG. 6 shows the dopant profile, taken vertically along the edge of the trenches, and contrasts the prior art dopant profile of the IGTO device of FIG. 3 with the dopant profile of the IGTO device of FIG. 5. As seen, the thickness of the n-layer 50 is reduced due to the implanted p-layer 60, resulting in a shorter channel length of the turn-off PMOS transistor.

The p-well 14 may be epitaxially grown over an n-type silicon wafer or may be implanted into to top surface of an n-type silicon wafer.

Figures 7, 8:
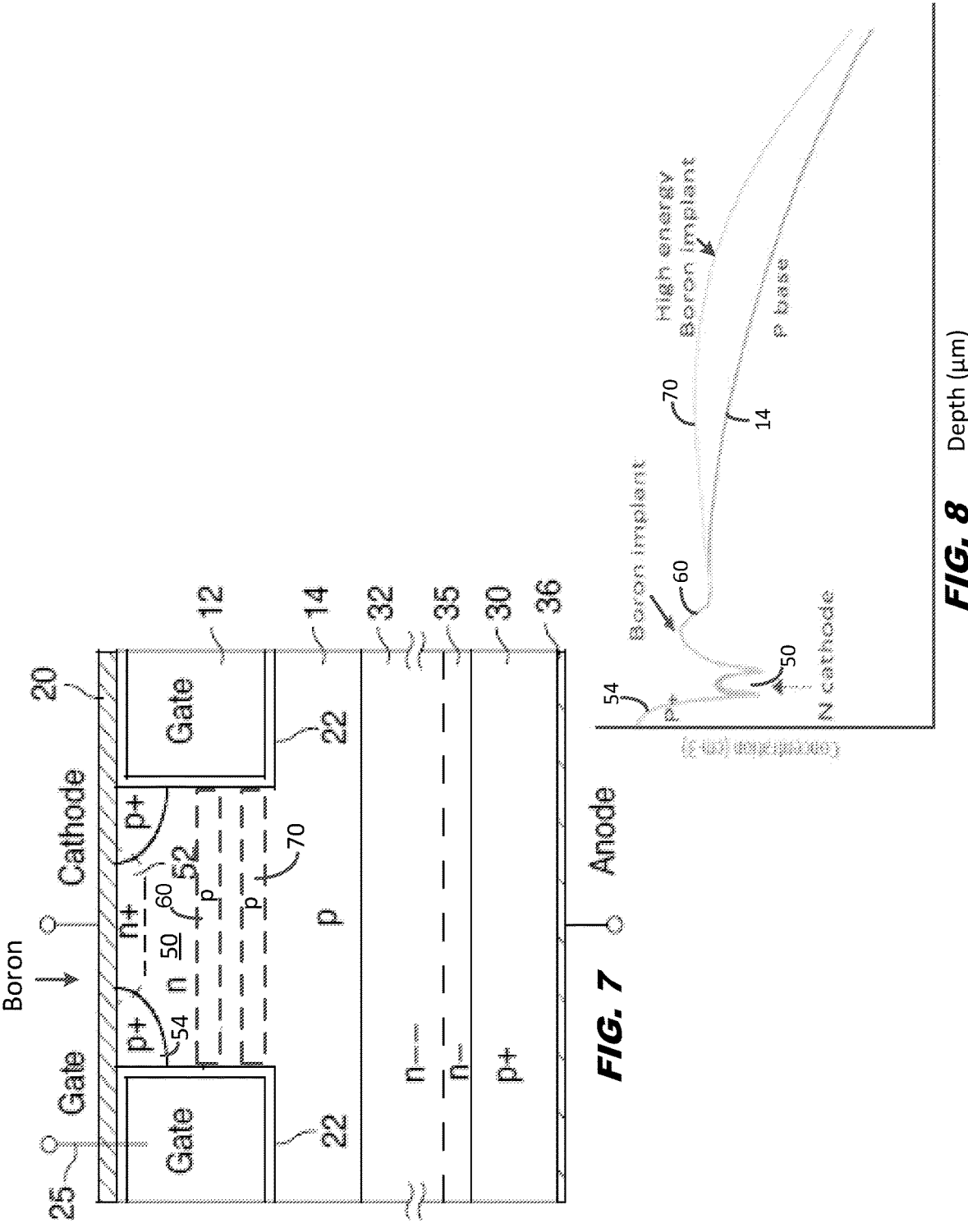
FIG. 7 is a cross-sectional view of a cell, in accordance with another embodiment of the invention, where there is a second extra boron implant to form another more highly doped p-layer vertically spaced from the bottom of the n-layer below the n+ source regions. This added p-layer controls the breakdown voltage independent from the threshold voltage.
FIG. 8 is a dopant profile of the device of FIG. 7 along the trench wall comparing the prior art dopant profile of FIG. 4 with the dopant profile of the device of FIG. 7.

FIG. 7 illustrates the formation of a second p-layer 70 that is below and separated from the p-layer 60. This p-layer 70 is formed using a high energy implant of boron into the top surface of the silicon. The dopant concentration of the p-layer 70 is greater than that of the p-well 14 and less than that of the p+ regions 54. The dopant concentration may be different from that of the p-layer 60.

The thickness and dopant concentration of the p-layer 70 affects the breakdown voltage of the IGTO device. So, the breakdown voltage can be optimally increased by the p-layer 70 without affecting the threshold voltages or characteristics of the other regions.

In one embodiment, not all the cells are identical and only some of the cells in the active area of a die include the p-channel MOSFET. In another embodiment, all the active cells include the p-channel MOSFET.

By using opposite doping polarities for all the semiconductor layers/regions, the IGTO device would be turned on by a negative gate threshold voltage. The operation would be similar as described above but with opposite polarity transistors in the equivalent circuit.

One possible method for fabricating the device of FIG. 5 is described below.

A starting p+ substrate 30 may have a dopant concentration of $1 \times 10^{18}$ to $2 \times 10^{19}$ $cm^{-3}$.

The n-type buffer layer 35 is then grown to a thickness of 3-10 microns thick and has a dopant concentration between about $10^{17}$ to $5 \times 10^{17}$ $cm^{-3}$.

The n– epi layer 32 is grown to a thickness of 40-70 microns (for a 600V device) and has a doping concentration between about $5 \times 10^{13}$ to $5 \times 10^{14}$ $cm^{-3}$. This dopant concentration can be obtained by in-situ doping during epi growth.

A field oxide is then grown to a thickness of, for example, 0.6-2 microns, to define the active area of the die. LOCOS technology may be used. The active areas are defined using a mask if LOCOS technology is not used. Otherwise, the active areas are defined by the LOCOS oxide mask.

The p-well 14 is then formed by masking and boron dopant implantation. Preferably, some of the doping of the p guard rings 29 (FIG. 1) is performed in the same patterned implant. The peak doping in the p-well 14 can be, for example, $10^{16}$-$10^{18}$ $cm^{-3}$. The depth of the p-well 14 depends on the maximum voltage of the device and may be between 0.5-10 microns.

The p-layers 60 and/or 70 are then formed by boron ion injection and a drive-in step. The p-layer 70 will typically be formed (including an anneal) prior to the formation of the p-layer 60. Alternatively, the p-layers 60 and 70 may be formed after the formation of the trenched gates and the doped layer/regions above them.

The n-layer 50 is then formed in the p-well 14 and doped to have a concentration greater than that of the n-epi layer 32. The depth of the n-layer is between the gate trench depth and the depth of the p+ region 54.

The n+ source region 52 is formed by an implant of arsenic or phosphorus at an energy of 10-150 keV and an area dose of $5 \times 10^{13}$ to $10^{16}$ cm$^{-2}$, to create a dopant concentration exceeding $10^{19}$ cm$^{-3}$. In one embodiment, the n+ source region 52 has a depth of 0.05-1.0 microns.

The p+ region 54 is then formed to a depth below that of the n+ source region 52 to have a dopant concentration exceeding $10^{19}$ cm$^{-3}$.

The gate trenches are then etched in the active areas. In one embodiment, the trenches can be, for example, 1-10 microns deep, but the minimum lateral trench widths are constrained by lithographic and etching limitations.

After the trenches are etched, gate oxide 22 is grown on the sidewalls and bottoms of the trenches to, for example, 0.05-0.15 microns thick. Conductive material, such as heavily doped polysilicon, then fills the trenches and is planarized to form the gate regions in all the cells.

An oxide layer 26 (FIG. 1) is deposited, and a contact mask opens the oxide layer 26 above the selected regions on the top surface to be contacted by metal electrodes.

Various metal layers are then deposited to form the gate electrode 25, the cathode electrode 20, and the anode electrode 36. The p+ substrate 30 may be thinned.

The p+ substrate 30 may be any p+ layer that is formed, and the original substrate may be removed. Accordingly, the substrate 30 may be also referred to as a "layer," whether it is a substrate or a formed layer on which the anode electrode 36 is deposited. Similarly, the implanted or diffused p-well 14 may be a p-type epitaxial layer doped during growth, where the term "layer" describes both the well and the epitaxial layer.

It is also possible to use an n-type lightly doped starting wafer and form a p+ layer (substituting for the p+ substrate 30) and the n-type buffer layer 35 by implantation and diffusion.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An insulated gate turn-off (IGTO) device formed as a die comprising:

a first semiconductor layer of a first conductivity type;

a second semiconductor layer of a second conductivity type overlying the first semiconductor layer;

a third semiconductor layer of the first conductivity type overlying at least a portion of the second semiconductor layer;

an array of cells comprising a plurality of insulated gate regions within trenches formed at least within the third semiconductor layer;

at least some of the cells comprising:

a first semiconductor region of the second conductivity type overlying the third semiconductor layer and adjacent to an insulated gate region;

a second semiconductor region of the first conductivity type overlying the first semiconductor region and adjacent to the insulated gate region;

a third semiconductor region of the second conductivity type adjacent the first semiconductor region and the second semiconductor region and being more highly doped than the first semiconductor region;

a fourth semiconductor region of the first conductivity type formed in the third semiconductor layer and below the first semiconductor region, the fourth semiconductor region having a dopant concentration higher than the dopant concentration of the third semiconductor layer and having a dopant concentration lower than the dopant concentration of the second semiconductor region, the fourth semiconductor region abutting a bottom of the first semiconductor region and extending between two opposing trenches without a gap between the fourth semiconductor region and the two opposing trenches; and a first conductor shorting the second semiconductor region to the third semiconductor region, wherein the first semiconductor region, the second semiconductor region, and the third semiconductor layer form a MOSFET, where a voltage applied to the insulated gate region greater than a threshold voltage of the MOSFET inverts the first semiconductor region adjacent to the insulated gate region to form a lower resistance path between the second semiconductor region and the third semiconductor layer to reduce a beta of a bipolar transistor formed by the third semiconductor region, the third semiconductor layer, and the second semiconductor layer to turn off the IGTO device.

2. The device of claim 1 further comprising a fifth semiconductor region of the first conductivity type spaced away from a bottom of the first semiconductor region and spaced away from a bottom of the fourth semiconductor region.

3. The device of claim 1 wherein the first conductivity type is a p-type, and the second conductivity type is an n-type.

4. The device of claim 1 wherein the first conductivity type is an n-type, and the second conductivity type is a p-type.

5. The device of claim 1 wherein in the second semiconductor region is more highly doped than the third semiconductor layer.

6. The device of claim 1 wherein the first semiconductor layer is a growth substrate.

7. The device of claim 1 wherein the third semiconductor layer is formed as a well.

8. The device of claim 1 wherein the first semiconductor region is formed as an epitaxial layer.

9. The device of claim 1 wherein the first semiconductor region is formed as a doped region.

10. The device of claim 1 wherein the third semiconductor layer has a variety of thicknesses, wherein a thickness of the third semiconductor layer below the insulated gate regions is less than a thickness of the third semiconductor layer between the insulated gate regions.

11. The device of claim 1 further comprising a first electrode electrically contacting the first semiconductor layer, and a second electrode electrically contacting the second semiconductor region and the third semiconductor region, wherein the second electrode is the first conductor.

12. The device of claim 11 wherein the first electrode is an anode electrode and the second electrode is a cathode electrode.

* * * * *